(12) United States Patent
Honma

(10) Patent No.: US 7,235,984 B2
(45) Date of Patent: Jun. 26, 2007

(54) PROBE DEVICE AND PROBE METHOD

(75) Inventor: Toru Honma, Nirasaki-shi (JP)

(73) Assignee: Tokyo Electron Limited, Tokyo (JP)

( * ) Notice: Subject to any disclaimer, the term of this patent is extended or adjusted under 35 U.S.C. 154(b) by 177 days.

(21) Appl. No.: 10/496,007

(22) PCT Filed: Nov. 12, 2002

(86) PCT No.: PCT/JP02/11792

§ 371 (c)(1),
(2), (4) Date: May 28, 2004

(87) PCT Pub. No.: WO03/049179

PCT Pub. Date: Jun. 12, 2003

(65) Prior Publication Data

US 2006/0145711 A1    Jul. 6, 2006

(30) Foreign Application Priority Data

Nov. 30, 2001  (JP) ............................. 2001-367266

(51) Int. Cl.
*G01R 27/26* (2006.01)
*G01R 31/02* (2006.01)
(52) U.S. Cl. ...................................... 324/662; 324/758
(58) Field of Classification Search ................ 324/662, 324/757, 758
See application file for complete search history.

(56) References Cited

U.S. PATENT DOCUMENTS

| | | | | | |
|---|---|---|---|---|---|
| 4,322,977 | A | * | 4/1982 | Sell et al. ..................... | 73/701 |
| 4,923,302 | A | * | 5/1990 | Ealey et al. ................. | 356/601 |
| 5,009,512 | A | * | 4/1991 | Lessi et al. .................... | 374/6 |
| 6,140,828 | A | * | 10/2000 | Iino et al. .................... | 324/758 |
| 6,707,310 | B2 | * | 3/2004 | Takekoshi .................... | 324/758 |
| 6,747,462 | B2 | * | 6/2004 | Fasen et al. ................. | 324/662 |
| 2004/0084824 | A1 | * | 5/2004 | Ogatsu ........................ | 269/58 |
| 2004/0227535 | A1 | * | 11/2004 | Kobayashi et al. .......... | 324/758 |

FOREIGN PATENT DOCUMENTS

| | | |
|---|---|---|
| JP | 2000-260852 | 9/2000 |
| JP | 2001-228212 | 8/2001 |

* cited by examiner

*Primary Examiner*—Anjan Deb
(74) *Attorney, Agent, or Firm*—Oblon, Spivak, McClelland, Maier & Neustadt, P.C.

(57) ABSTRACT

A probe device 20 having a contact load monitoring device 10. This contact load monitoring device measures the displacement of a loading table caused by a contact load exerted on the mounting table from a probe in an overdrive by means of a displacement sensor 11 disposed in the space below the mounting table as a sinkage quantity. This sinkage quantity is collated with a correlation table to determine the contact load. If the contact load is less than the designed contact load, the mounting table is further overdriven.

10 Claims, 5 Drawing Sheets

PROBE DEVICE AND PROBE METHOD

The present application is based upon and claims the benefit of priority from the prior Japanese Patent Application No. 2001-367266 filed on Nov. 30, 2001, the entire contents of which are incorporated herein by reference.

FIELD OF THE INVENTION

The present invention relates to a probe device; and, more particularly, to a probe device capable of detecting a contact load, which is exerted on a mounting table when probes are in contact therewith during inspection, based on an amount of resultant sinking of the mounting table.

BACKGROUND OF THE INVENTION

In an inspection process of a semiconductor device, a probe device is widely employed as an inspection device of a semiconductor wafer (hereinafter referred to as a wafer) As shown in FIGS. 2A and 2B, the probe device includes a loader chamber 1 and a prober chamber 2, and inspects electrical characteristics of semiconductor devices (hereinafter referred to as "devices") formed on the wafer. Incorporated in the loader chamber 1 are a cassette mounter 3 for mounting thereon a cassette C accommodating therein a plurality (e.g., 25 sheets) of wafers W; a wafer transfer mechanism 4 for transferring wafers W from the cassette mounter 3 sheet by sheet; and a pre-alignment mechanism (hereinafter referred to as a "sub-chuck") 5 for pre-aligning the wafers W transferred via the wafer transfer mechanism 4. The prober chamber 2 includes a mounting table 6 (hereinafter referred to as a "main chuck") which is moved in X, Y, Z and θ directions via an XY-table, a linear driving mechanism and a θ driving mechanism; an alignment mechanism 7 which performs alignment of a wafer W in cooperation with the main chuck 6; a probe card 8 disposed above the main chuck and provided with a number of probes 8A; and a test head T interposed between the probe card 8 and a tester (not shown). The probe device further includes a display unit 9 for displaying, e.g., an operational menu and an inspection result.

In the prober chamber 2, after the wafer W is aligned with the probes 8A, the main chuck 6, on which the wafer W is mounted, is index fed while concurrently being elevated, so that the probes 8A are brought into contact with electrodes on the devices formed on the wafer W at a predetermined probe pressure (contact load). The electrical characteristics of the devices are inspected while such a contact state is being maintained. At this time, by overdriving the main chuck 6 relative to the probes 8A by a predetermined amount, the probes 8A are considered to be in electrical contact with the wafer W under a substantially constant contact load.

Recently, however, the number of devices that need to be measured simultaneously (the number of simultaneous measurements) is increasing. For example, the number of simultaneous measurements is as many as 32 and the contact load between the probes 8A and the main chuck 6 is greater than 20 kg. Moreover, the probe card 8 is repeatedly expanded and contracted due to an aging thereof of the probe card 8 or a thermal influence from an accelerated test conducted at a high temperature. As a result, the contact load of the probe card 8 that acts on the main chuck 6 varies despite a constant amount of overdriving of the main chuck 6. Therefore, there is a need for a stabilization of the contact load.

For example, FIG. 3 schematically describes such a phenomenon. The main chuck 6 does not rise up to a target position during an overdrive stage, which is marked by a dashed dotted line in FIG. 3, but instead sinks to a position marked by a solid line in the same drawing due to the contact load exerted on the main chuck 6 by the probe card 8. That is, the main chuck 6 is lowered by a slight amount of distance δ, resulting in a failure to obtain a desired contact load. Consequently, an inspection reliability is reduced. Conversely, if an overdriving amount is determined by predicting an amount of sinking of the main chuck 6, the contact load may become excessively large, to shorten a lifetime of the probe card 8.

The applicant proposed a probe method and a probe device employing a pressure sensor in Japanese Patent Publication Laid-open No. 2001-110857. In case of measuring a load by using the pressure sensor, the pressure sensor detects a pressure based on a deformation of itself. Since the pressure sensor is placed near an operating point of the load, e.g., directly underneath the mounting table, i.e., between the mounting table and the linear driving mechanism, the deformation of the pressure sensor itself increases a displacement of the mounting table. Thus, a certain amount of time is required to correct the load including the is deformation of the pressure sensor itself.

Furthermore, the applicant proposed in U.S. patent application Ser. No. 09/776,686 that a measurement mechanism provided with a linear sensor and a linear scale be installed at a peripheral portion of a support member of the main chuck in order to measure a contact load between the main chuck and the probes. Since, however, the measurement mechanism is disposed at the peripheral portion of the support member of the main chuck, additional space around the peripheral portion of the support member needs to be allocated therefor. Further, there may be produced an error resulting from expansions and contractions of the linear scale due to a temperature change.

SUMMARY OF THE INVENTION

It is, therefore, an object of the present invention to solve the above-mentioned problems. In accordance with one aspect of the present invention, a constant contact load can be obtained by detecting a contact load through a sinking amount of a mounting table (hereinafter referred to as a main chuck) during inspection. In accordance with another aspect of the present invention, a highly reliable inspection can be performed. In accordance with still another aspect of the present invention, there is provided a probe device capable of rapidly revising a load without deforming a sensor. In accordance with still another aspect of the present invention, a displacement sensor for measuring the sinking amount of the mounting table can be located in an efficient space. In accordance with still another aspect of the present invention, the sinking amount of the mounting table can be accurately obtained.

Other objects and advantages of the present invention will be described in a specification to be provided hereinafter, and some of them will become apparent from a corresponding description or from an implementation of the present invention. Corresponding objects and advantages of the present invention are accomplished and obtained by means particularly specified herein and a combination thereof.

In accordance with one aspect of the present invention, there is provided a probe device for inspecting electrical characteristics of an object W to be inspected, including: a mounting table for mounting thereon the object to be inspected, the mounting table being movable in X, Y, Z and θ directions; a probe card disposed above the mounting table and provided with a plurality of probes; and a contact load monitoring device including at least one displacement sensor and a control device and monitoring a contact load exerted on the mounting table by the probes during an overdriving stage, wherein the displacement sensor is disposed in a space below the mounting table and measures, as an amount of sinking, a displacement of a reference surface at a bottom side of the mounting table caused by the contact load exerted on the mounting table by the probes during the overdriving stage; wherein the control device is provided with a correlation table for amounts of sinking of the reference surface of the mounting table and contact loads and estimates a contact load by using the displacement measured by the displacement sensor and the correlation table; and wherein the control device adjusts the contact load to be identical with a designed contact load by further elevating the mounting table in case the contact load is less than the predetermined designed contact load.

Preferably, the displacement sensor of the probe device may be preferably an analog output or a digital output displacement sensor.

Further, the displacement sensor of the probe device may be preferably a capacitive displacement sensor or an eddy current displacement sensor.

Moreover, it may be preferable that the displacement sensor is disposed at at least one of a center of the mounting table and plural locations therearound.

In accordance with another aspect of the present invention, there is provided a method for inspecting electrical characteristics of an object to be inspected by using the probe device of claim 1, including the steps of: (a) setting a designed overdriving amount and a designed contact load corresponding to the object W to be inspected in the control device; (b) bringing the object to be inspected into contact with the probes by elevating the mounting table on which the object to be inspected is mounted; (c) overdriving the mounting table based on the designed overdriving amount; (d) monitoring whether the contact load exerted on the mounting table is identical with the designed contact load by using the contact load monitoring device, wherein the monitoring step (d) has the steps of: (d1) measuring the displacement of the reference surface at a bottom side of a support member as the amount of sinking of the mounting table and outputting the measured displacement to the control device by the displacement sensor; (d2) estimating the contact load corresponding to the displacement based on the correlation table and comparing the estimated contact load with the designed contact load by the control device; (d3) further elevating the main chuck in case the contact load estimated based on the displacement measured by the displacement sensor is less than the designed contact load; and (d4) repeating the steps (d1) through (d3) and stopping the elevation of the main chuck when the contact load based on the displacement measured by the displacement sensor reaches the designed contact load and (e) inspecting the electrical characteristics of the object W to be inspected.

BRIEF DESCRIPTION OF THE DRAWINGS

FIGS. 2A and 2B describe an example of a conventional probe device, wherein FIG. 2A is a partial cutaway view showing main parts thereof and FIG. 2B is a plan view thereof;

DETAILED DESCRIPTION OF THE PREFERRED EMBODIMENTS

Figure 1:
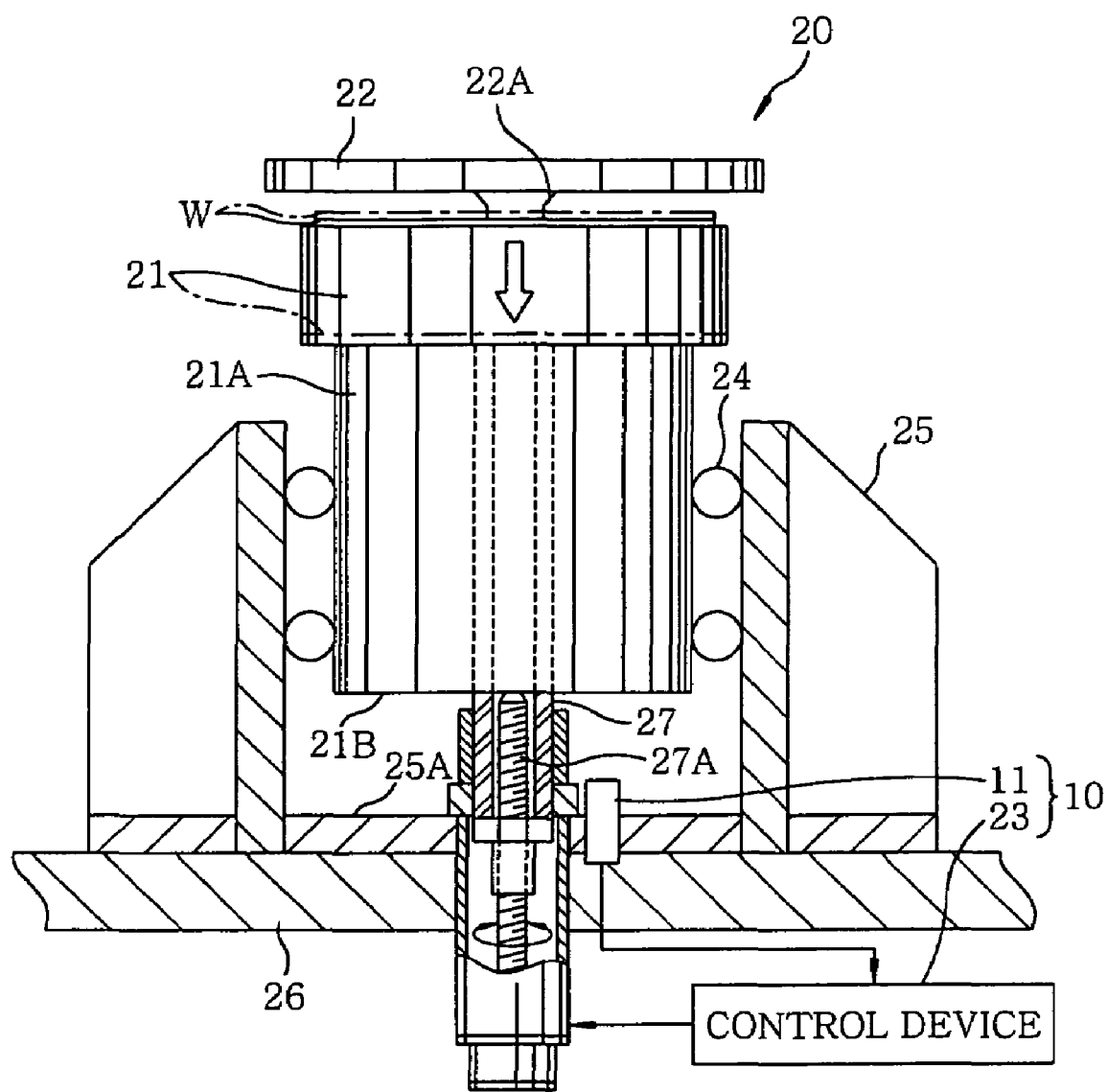
FIG. 1 is a schematic cross sectional view of main parts of a probe device in accordance with a first preferred embodiment of the present invention.

The present invention will now be described with reference to an embodiment shown in FIG. 1. As shown in FIG. 1, a probe device 20 of the present embodiment is provided with a contact load monitoring device 10 for monitoring a contact load exerted by a probe card 22 during inspection.

Figure 2A:
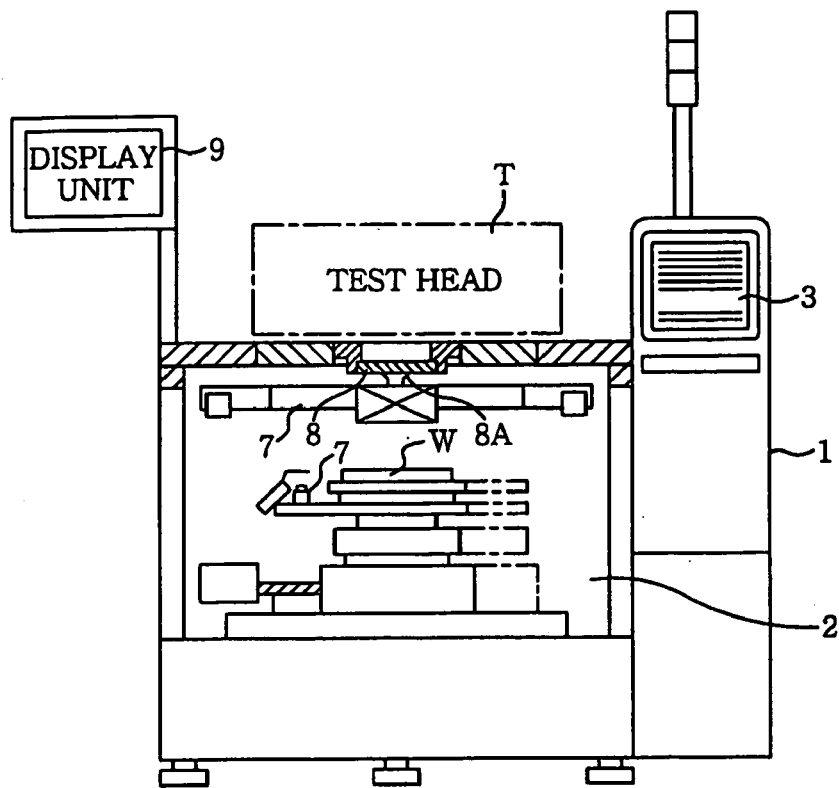

The probe device 20 of the preferred embodiment will now be described. As shown in FIG. 1, the probe device 20 of the present invention may include, for example, an XY stage 26; a linear driving mechanism 27; a main chuck 21 capable of moving in X, Y, Z and θ directions while carrying a wafer W mounted thereon; the probe card 22 disposed above the main chuck 21 and provided with a plurality of probes 22A; and an alignment mechanism 7 (see FIG. 2A) to determine the position of the wafer W mounted on the main chuck 21. Under the control of a control device 23, the aligned main chuck 21 is elevated, so that the wafer W is brought into contact with the probes 22A. Electrical characteristics of devices formed on the wafer W are inspected while such a contact state is maintained.

The main chuck 21 is mounted on the XY stage 26. The XY stage moves in X and Y directions. Provided on the XY stage is the linear driving mechanism 27 formed of, e.g., a ball screw 27A. The linear driving mechanism 27 moves the main chuck 21 up and down in a vertical direction (Z direction) and is embedded in, e.g., a support member 21A for supporting the main chuck 21. The support member 21A is elevatably accommodated in a housing 25 via bearings 24. The main chuck 21 is moved up and down in the vertical direction (Z direction) via the linear driving mechanism 27 in the housing 25.

The contact load monitoring device 10 includes a displacement sensor 11 positioned in a space below the mounting table. As shown in FIG. 1, the displacement sensor 11 measures a displacement of a reference surface 21B at a bottom side of the support member 21 as the amount of sinking of the main chuck 21. The contact load monitoring device 10 monitors the amount of sinking of the main chuck 21 caused by a contact load exerted on the main chuck during inspection. A conventional analog or digital output displacement sensor, for example, can be employed as the displacement sensor 11. The analog output sensor may be, e.g., a capacitive displacement sensor, an eddy current displacement sensor or the like. The digital output displacement sensor may be, e.g., a laser interference displacement sensor. Further, the displacement sensor 11 is not limited to such a non-contact sensor but instead can be of a contact sensor.

In the preferred embodiment, the displacement sensor 11 can be disposed directly underneath the support member 21A, as shown in FIG. 1. The bottom end surface 21B of the support member 21A can be used as the reference surface 21B of the bottom side of the main chuck 21. Therefore, if the contact load is exerted on the main chuck 21, the displacement sensor 11 can detect the amount of sinking of the main chuck 21 through the support member 21A.

Figure 2B:
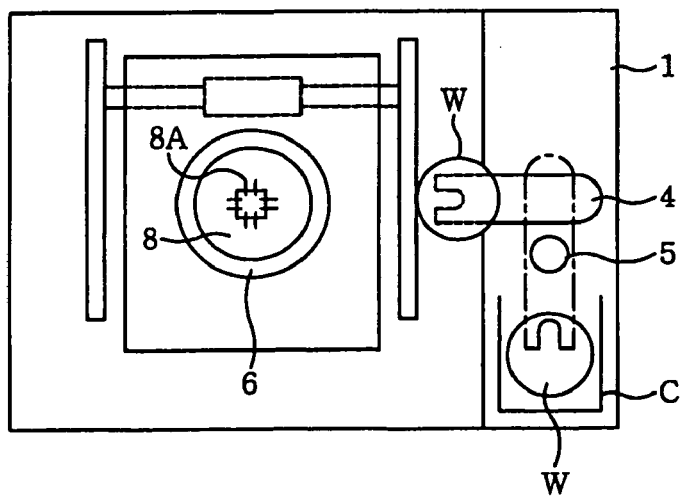
Figure 3:
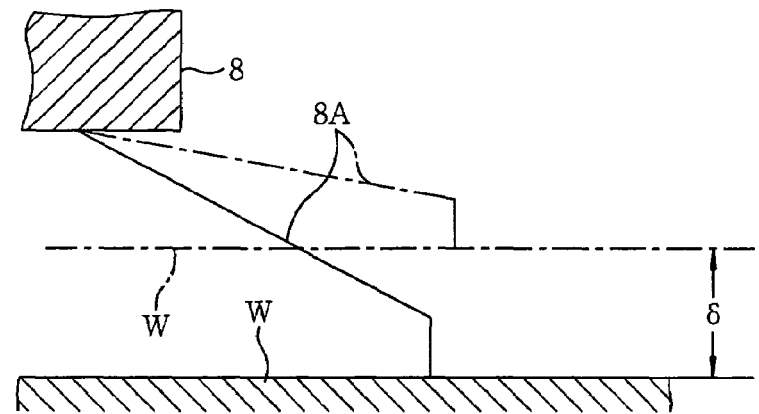
FIG. 3 illustrates an electrical contact state between a probe of the probe device and a wafer shown in FIGS. 2A and 2B.

Thus, various loads are subsequently applied to plural spots on the main chuck 21 in advance, and a load applied to each spot and its corresponding amount of sinking are measured. Such measurement can be carried out by measuring a change in the distance between the bottom end surface 21B of the support member 21A and a bottom surface 25A of the housing 25. Further, a correlation between a contact load and a displacement provided by the displacement sensor 11 is obtained at each of the plural spots on which the loads are applied, and a correlation table created based thereon is stored in a memory unit of the control device 23. By collating the displacement obtained by the displacement sensor 11 with data in the correlation table, the contact load is obtained, which is then fedback to the linear driving mechanism. At this point, the contact load and so on may be displayed on the display unit 9 (see FIG. 2). A designed overdriving amount for the wafer W to be inspected is also set in the control device 23 in advance. The designed overdriving amount is used as a reference (target) of an overdriving amount during inspection.

In inspecting the electrical characteristics of the wafer W, the main chuck 21 is overdriven based on the designed overdriving amount. If the probes 22A of the probe card 22 apply a contact load on the wafer W mounted on the main chuck 21, the main chuck 21 sinks. The amount of sinking is detected as a displacement by the displacement sensor 11. The control device 23 estimates a contact load corresponding to the displacement based on the correlation table, and compares the estimated contact load with a designed contact load. In case the estimated contact load is less than the designed contact load even after the main chuck 21 is overdriven by a distance corresponding to the designed overdriving amount, the control device 23 further overdrives the main chuck 21. If a resultant estimated contact load reaches the designed contact load, the control device 23 stops the linear driving mechanism 27. In this state, the wafer W mounted on the main chuck 21 is inspected for the electrical characteristics thereof. Accordingly, the probe device 20 can always perform an inspection of each device on the wafer W under a predetermined contact load (designed contact load).

Next, an operation of the probe device 20 employing the contact load monitoring device 10 will now be described.

(S1) A designed overdriving amount and a designed contact load corresponding to a wafer W are set in the control device 23 in advance.

(S2) Then, an inspection is initiated. The wafer W is mounted on the main chuck 21 by the wafer W transfer mechanism 4 (see FIG. 2B) in the loader chamber under the control of the control device 23.

(S3) The main chuck 21 is moved in the X, Y and θ directions based on data from the alignment mechanism 7 (see FIG. 2A) to thereby align the wafer W to the probes 22A.

(S4) By moving the main chuck in the X, Y and θ directions, to-be-inspected devices, among devices formed on the wafer W, are located underneath the probes 22A.

(S5) The main chuck 21 is moved to a first inspection position. Devices to be inspected first are located directly underneath the probes 22A by the main chuck 21 and the main chuck 21 is elevated within the housing 25 along with the support member 21A by the linear driving mechanism under the control of the control device 23, so that the wafer W mounted on the main chuck 21 is brought into contact with the probes 22A of the probe card 22.

(S6) Further, the linear driving mechanism overdrives the main chuck 21 based on the designed overdriving amount until the main chuck 21 reaches a position (marked by a dashed dotted line in FIG. 1) at which the designed contact load is expected to be obtained. Since, however, a con tact load is exerted on the main chuck 21 in a direction marked by an arrow in FIG. 1, the main chuck 21 sinks from a position marked by the dashed dotted line to a position marked by a solid line in FIG. 1. Consequently, the designed contact load cannot be attained even though the main chuck 21 is elevated by a distance corresponding to the designed overdriving amount.

(S7) The contact load monitoring device 10 monitors whether the designed contact load is obtained. That is, the main chuck 21 sink slightly owing to the contact load applied from the probe 22A to the main chuck 21 overdriven by the control device 23. The displacement sensor 11 detects that amount of sinking as the displacement of the reference surface 21B at the bottom side of the support member 21A. The displacement sensor 11 then outputs the detected displacements to the control device 23.

(S8) The control device 23 estimates the contact load corresponding to the detected displacement based on the correlation table.

(S9) Then, the estimated contact load is compared with the designed contact load.

(S10) If the applied contact load is found to be less than the designed contact load even after the main chuck 21 is elevated by as much as the designed overdriving amount to thereby be located at the position marked by the solid line in FIG. 1, the main chuck 21 is further raised up to the position indicated by the dashed dotted line in FIG. 1 under the control of the control device 23.

(S11) When a contact load estimated based on a displacement detected by the displacement sensor 11 becomes identical with the designed contact load, the control device 23 outputs a stop signal to the linear driving mechanism. Then, the elevation of the main chuck 21 is stopped by the linear driving mechanism.

(S12) In this state, the electrical characteristics of the devices formed on the wafer W mounted on the main chuck 21 are inspected.

(S13) It is checked whether all the to-be-inspected devices formed on the wafer are inspected.

If any device to be inspected is not inspected, the step S4 is repeated to inspect such devices.

If all the to-be-inspected devices are inspected, the linear driving mechanism 27 lowers the main chuck 21.

In accordance with the present embodiment, inspection can be carried out while always applying a constant designed contact load on the wafer W, even under the influence of, for example, an increase of a contact load due to the increase in the number of devices inspected at one time, an aging of the probe card 22 due to repeated use, and repeated thermal expansions and contractions of the probe card 22 due to a thermal influence, e.g., an accelerated test performed at a high temperature. As a result, the inspection can be performed with a higher reliability.

In accordance with the present embodiment, there is prepared the contact load monitoring device 10 in which the displacement sensor 11 positioned in the space underneath the support member 21A measures a displacement of the reference surface 21B at the bottom end side of the support member 21A as an amount of sinking of the main chuck 21 during an overdrive stage. The contact load monitoring device 10 always accurately detect the amount of sinking of the main chuck 21 during the overdrive stage. Further, the present embodiment includes the control device 23 for monitoring the designed contact load based on the measurement result from the displacement sensor 11. The control device enables a constant contact load (designed contact load), thereby realizing a highly reliable inspection. Since the control device performs the inspection under an optimum contact load, the lifetime of the probe card 22 can be extended. The displacement sensor 11 may be an analog or a digital output displacement sensor of a contact or a non-contact type. The displacement sensor 11 can promptly correct a contact load without a deformation thereof and, in addition, estimate a high precision contact load.

In accordance with the present embodiment, since the displacement sensor for measuring the amount of sinking of the main chuck is placed in the space below the main chuck, an efficient use of space is possible without requiring an additional space for the installation of the displacement sensor. Further, by not using, for example, a linear scale whose scale varies depending on a change in temperature, a measurement precision can be improved.

Figure 4:
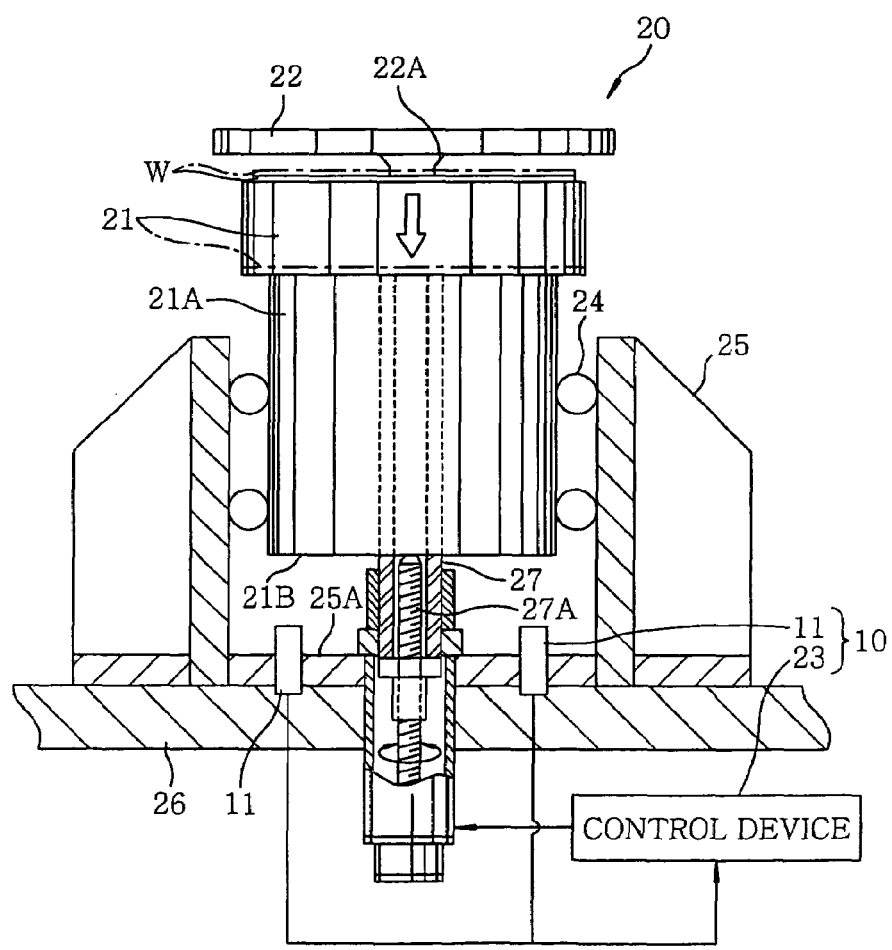
FIG. 4 provides a schematic cross sectional view of main parts of a probe device in accordance with a second preferred embodiment of the preset invention.
Figure 5A:
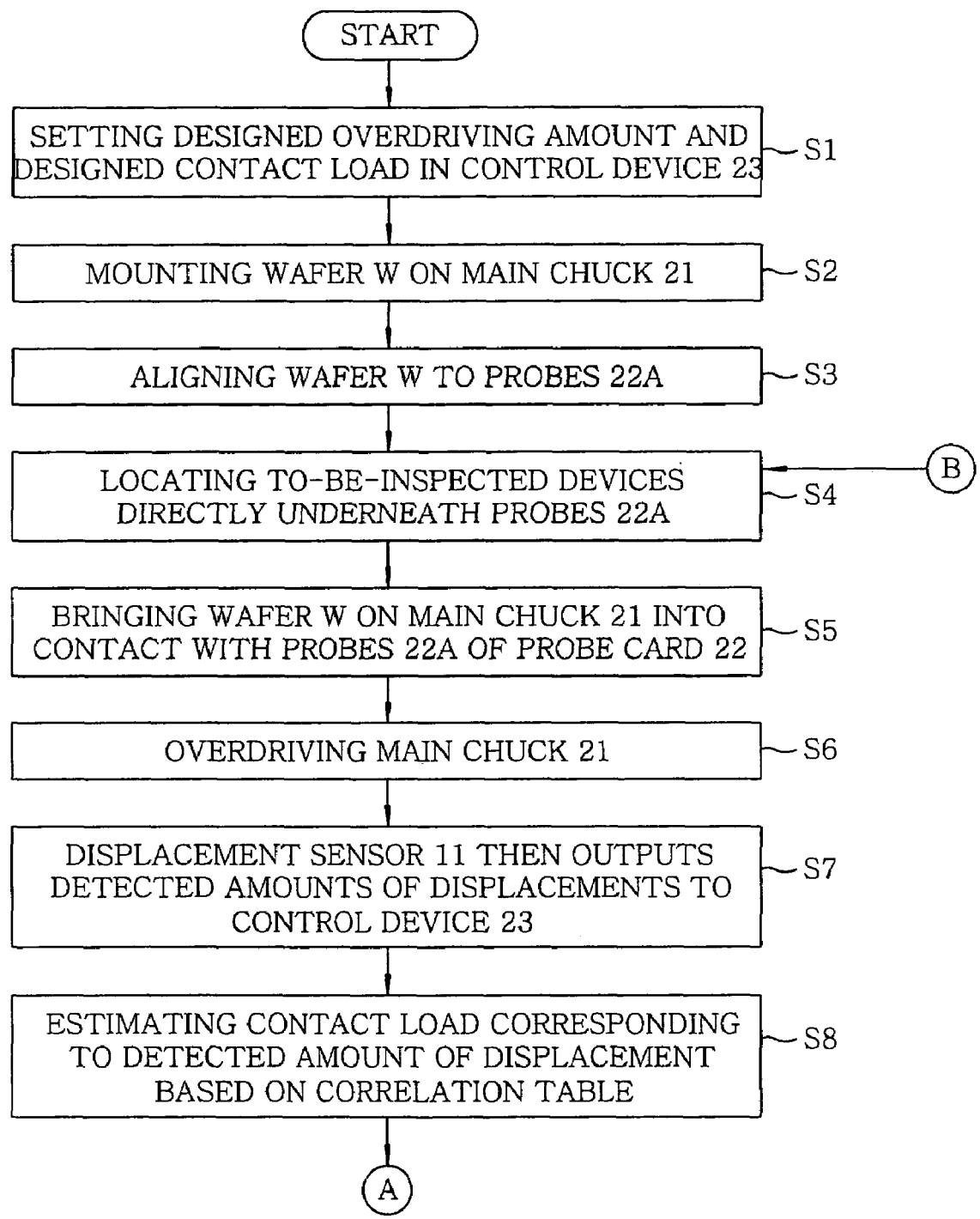
FIGS. 5A and 5B set forth a flow chart schematically explaining a probe method in accordance with the present invention.
Figure 5B:
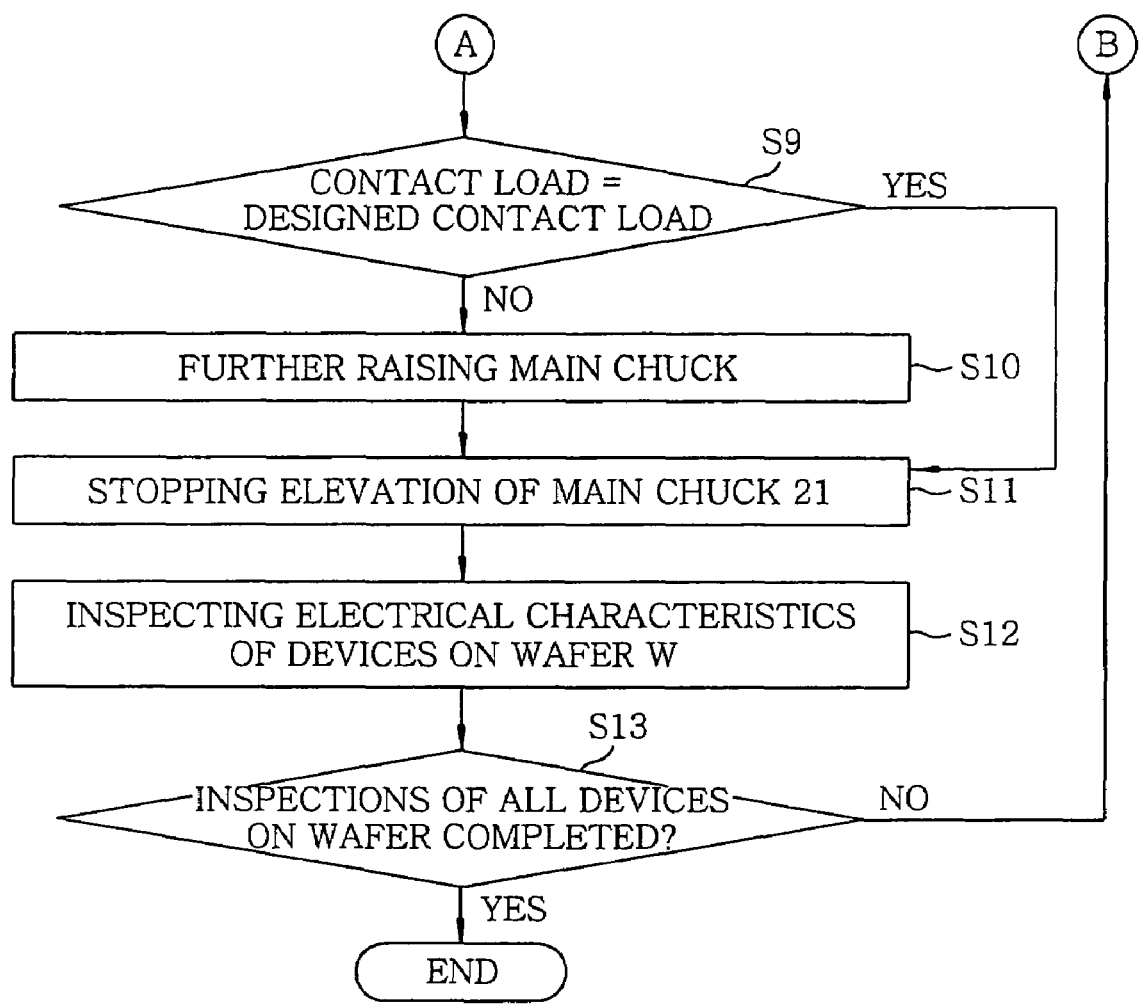

Furthermore, though a center of the bottom end surface of the support member 21A is used as the reference surface at the bottom side of the main chuck 21 in the present embodiment, a plurality of spots surrounding the center of the bottom end surface of the support member 21A can be used as reference surfaces. In such case, a plurality of displacement sensors 11 are respectively installed at positions corresponding to the plurality of reference surfaces, as illustrated in FIG. 4. The displacement sensors are preferably equidistanced from the center. Furthermore, any flat surface other than the one located at the center of the main chuck 21 and the bottom end surface of the support member 21A can also be used as a reference surface.

Though the above embodiment has been described for the case of using the contact load monitoring device 10 in the probe device 20 for inspecting the wafer W, the contact load monitoring device 10 can be widely employed for various objects to be inspected, e.g., substrates for LCD.

INDUSTRIAL APPLICABILITY

The present invention provides a probe device capable of performing an inspection with an enhanced inspection reliability by allowing an object to be inspected to contact probes under a constant contact load while promptly and accurately estimating a contact load and correcting it to a predetermined value.

Other features and modifications may be conceived by those skilled in the art. Therefore, the present invention is not limited to the representative embodiments disclosed herein but should be understood from a wider viewpoint.

Accordingly, it is apparent that various changes and modifications may be made without departing from the interpretation and scope of the inventions broadly defined in the following claims and their equivalents.

What is claimed is:

1. A probe device for inspecting electrical characteristics of an object W to be inspected, comprising:
   a mounting table for mounting thereon the object to be inspected, the mounting table being movable in X, Y, Z and θ directions;
   a probe card disposed above the mounting table and provided with a plurality of probes; and
   a contact load monitoring device including at least one displacement sensor and a control device and monitoring a contact load exerted on the mounting table by the probes during an overdriving stage,
   wherein the displacement sensor is disposed in a space below the mounting table and measures, as an amount of sinking, a displacement of a reference surface at a bottom side of the mounting table caused by the contact load exerted on the mounting table by the probes during the overdriving stage;
   wherein the control device is provided with a correlation table for amounts of sinking of the reference surface of the mounting table and contact loads and estimates a contact load by using the displacement measured by the displacement sensor and the correlation table; and
   wherein the control device adjusts the contact load to be identical with a designed contact load by further elevating the mounting table in case the contact load is less than the designed contact load.

2. The probe device of claim 1, wherein the displacement sensor is one of an analog and a digital output displacement sensor.

3. The probe device of claim 1, wherein the displacement sensor is one of a capacitive displacement sensor and an eddy current displacement sensor.

4. The probe device of claim 1, wherein the displacement sensor is disposed on at least one of a center of the mounting table and a plural locations therearound.

5. A method for inspecting electrical characteristics of an object to be inspected by using the probe device of claim 1, comprising the steps of:
   (a) setting a designed overdriving amount and a designed contact load corresponding to the object W to be inspected in the control device;
   (b) bringing the object to be inspected into contact with the probes by elevating the mounting table on which the object to be inspected is mounted;
   (c) overdriving the mounting table based on the designed overdriving amount;
   (d) monitoring whether the contact load exerted on the mounting table is identical with the designed contact load by using the contact load monitoring device, wherein the monitoring step (d) includes the steps of:
      (d1) measuring the displacement of the reference surface at a bottom side of a support member as the amount of sinking of the mounting table and outputting the measured displacement to the control device by the displacement sensor disposed in a space below the mounting table;
      (d2) estimating the contact load corresponding to the displacement based on the correlation table and comparing the estimated contact load with the designed contact load by the control device;
      (d3) further elevating the main chuck in case the contact load estimated based on the displacement measured by the displacement sensor is less than the designed contact load; and
      (d4) repeating the steps (d1) through (d3) and stopping the elevation of the main chuck when the contact load based on the displacement measured by the displacement sensor reaches the designed contact load; and
   (e) inspecting the electrical characteristics of the object W to be inspected.

6. A probe device for inspecting electrical characteristics of an object to be inspected, said probe device comprising:

a movable mounting table configured to mount thereon the object to be inspected;

a probe card disposed above said movable mounting table and provided with a plurality of probes; and a contact load monitoring device including a displacement sensor and a control device, said contact load monitoring device being configured to monitor a contact load exerted on said mounting table by said plurality of probes during an overdriving stage, wherein said displacement sensor is disposed underneath said mounting table, said displacement sensor being configured to measure a displacement of a reference surface at a bottom side of said mounting table during the overdriving stage, wherein said control device is provided with a correlation table for estimating the contact load based on the displacement of said reference surface, and wherein said control device is configured to adjust the contact load to be equal to a designed contact load by moving said mounting table to achieve a displacement of said reference surface that correlates to the designed contact load based on the correlation table.

7. The probe device of claim 6, wherein said displacement sensor is one of an analog displacement sensor and a digital output displacement sensor.

8. The probe device of claim 6, wherein said displacement sensor is one of a capacitive displacement sensor and an eddy current displacement sensor.

9. The probe device of claim 6, wherein said displacement sensor is disposed on at least one of a center of said mounting table and plural locations therearound.

10. A method for inspecting electrical characteristics of an object to be inspected using a probe device including a movable mounting table, a probe card provided with a plurality of probes, and a contact load monitoring device including a displacement sensor and a control device, said method comprising the steps of:

(a) setting a designed overdriving amount and a designed contact load corresponding to the object to be inspected in the control device;

(b) bringing the object to be inspected into contact with the probes by elevating the mounting table on which the object to be inspected is mounted;

(c) overdriving the mounting table based on the designed overdriving amount;

(d) monitoring whether the contact load exerted on the mounting table is identical with the designed contact load by using the contact load monitoring device, wherein the monitoring step (d) includes the steps of:

(d1) measuring a displacement of a reference surface at a bottom side of the mounting table as an amount of sinking and outputting the measured displacement to the control device, using the displacement sensor disposed underneath the mounting table;

(d2) estimating the contact load corresponding to the displacement based on a correlation table in the control device and comparing the estimated contact load with the designed contact load;

(d3) further elevating the main chuck in case the contact load estimated based on the displacement measured by the displacement sensor is less than the designed contact load; and (d4) repeating the steps (d1) through (d3) and stopping the elevation of the main chuck when the contact load based on the displacement measured by the displacement sensor reaches the designed contact load; and (e) inspecting the electrical characteristics of the object to be inspected.

* * * * *